US011289354B2

(12) United States Patent
Kakinuma et al.

(10) Patent No.: US 11,289,354 B2
(45) Date of Patent: Mar. 29, 2022

(54) CONVEYING MECHANISM

(71) Applicant: DISCO CORPORATION, Tokyo (JP)

(72) Inventors: Yoshinori Kakinuma, Tokyo (JP); Masashi Kimura, Tokyo (JP); Masayuki Kawase, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 17/195,995

(22) Filed: Mar. 9, 2021

(65) Prior Publication Data

US 2021/0305065 A1 Sep. 30, 2021

(30) Foreign Application Priority Data

Mar. 31, 2020 (JP) .............................. JP2020-061923

(51) Int. Cl.
| | |
|---|---|
| *H01L 21/687* | (2006.01) |
| *H01L 21/677* | (2006.01) |
| *H01L 21/683* | (2006.01) |
| *B23Q 7/04* | (2006.01) |
| *B65G 49/07* | (2006.01) |

(52) U.S. Cl.
CPC .............. *H01L 21/677* (2013.01); *B23Q 7/04* (2013.01); *B65G 49/07* (2013.01); *H01L 21/687* (2013.01); *H01L 21/6838* (2013.01)

(58) Field of Classification Search
CPC ......... B23Q 7/04; B65G 49/07; H01L 21/677; H01L 21/6838; H01L 21/687
See application file for complete search history.

(56) References Cited

U.S. PATENT DOCUMENTS

| | | | | | |
|---|---|---|---|---|---|
| 3,984,006 | A | * | 10/1976 | Takeyasu ................ | B23P 19/12 414/730 |
| 4,179,783 | A | * | 12/1979 | Inoyama ................. | B23P 19/12 901/45 |
| 4,669,192 | A | * | 6/1987 | Matheson .............. | G01B 13/19 33/644 |
| 4,720,923 | A | * | 1/1988 | Quinton ................ | B23P 19/102 901/45 |
| 4,753,048 | A | * | 6/1988 | Asada .................. | B25J 15/0019 451/28 |
| 4,932,806 | A | * | 6/1990 | Eklund ..................... | A61F 2/64 464/56 |

(Continued)

FOREIGN PATENT DOCUMENTS

JP 2014194991 A 10/2014

*Primary Examiner* — Saul Rodriguez
*Assistant Examiner* — Brendan P Tighe
(74) *Attorney, Agent, or Firm* — Greer Burns & Crain Ltd.

(57) ABSTRACT

A conveying mechanism includes a suction part that has a suction pad and sucks and holds a target object by the suction pad, a bracket connected to the suction part through a joint that is swingable, an elastic component in which one end part is fixed to the suction part and the other end part is fixed to the bracket, a negative pressure control unit that controls generation of a negative pressure at the suction part, and a movement unit that moves the bracket. The elastic component permits a swing of the suction part according to tilt or deformation of the target object that is sucked and held and, when suction holding of the target object is released, the elastic component returns the orientation of the suction pad to a predetermined orientation when the suction pad is not sucking and holding the target object.

4 Claims, 15 Drawing Sheets

(56) References Cited

U.S. PATENT DOCUMENTS

2007/0294903 A1* 12/2007 Joo .................. B23P 19/105
33/644
2017/0057091 A1* 3/2017 Wagner ............... B25J 9/1638

* cited by examiner

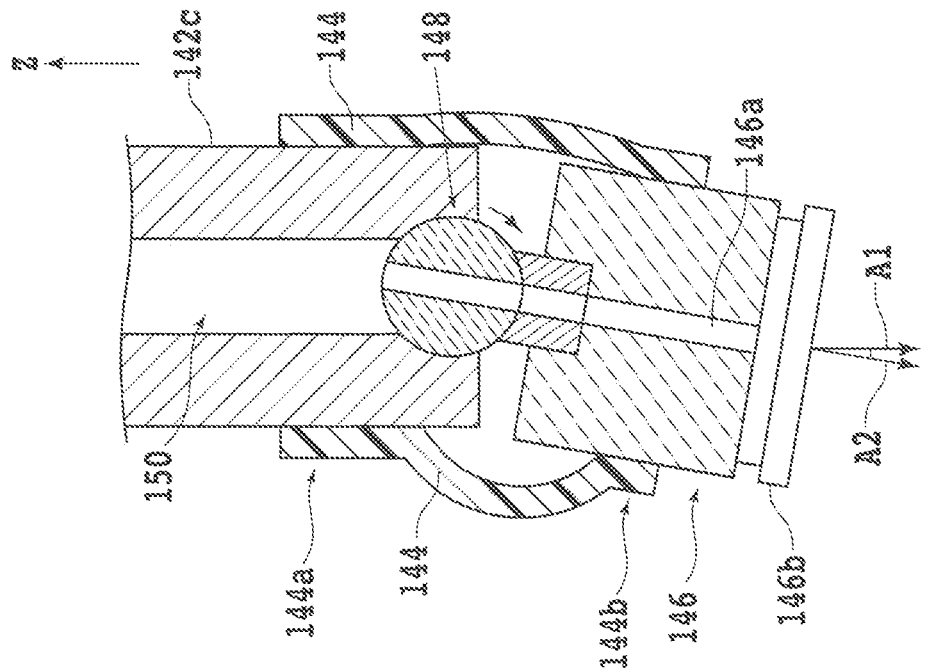
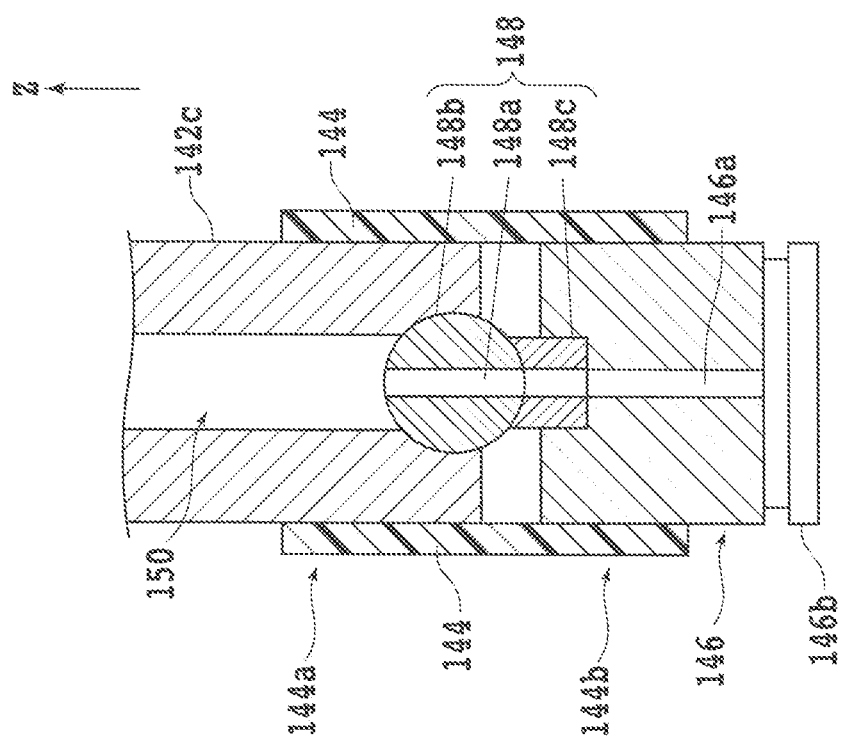

CONVEYING MECHANISM

BACKGROUND OF THE INVENTION

Field of the Invention

The present invention relates to a conveying mechanism that sucks and holds a target object and conveys it and a sheet expanding apparatus that expands a sheet stuck to a plate-shaped object.

Description of the Related Art

A conveying mechanism that sucks and conveys a sheet-shaped target object having flexibility and expandability/contractibility is known. This conveying mechanism includes a bracket that has a substantially H-shape in top view and is made of a metal, for example. Plural suction units are disposed on the bracket. Each suction unit has a suction part including a suction pad and a joint disposed between the suction part and the bracket. When a target object is sucked and held by the conveying mechanism, the target object is deformed or tilted in some cases. As a countermeasure against this, the following technique is known. Specifically, a joint is configured to be swingable (that is, be capable of oscillation). Due to this, even when deformation, tilt, or the like occurs in a target object, the orientation of the bottom surface of a suction pad is caused to follow a surface of the target object, and the target object is properly held (for example, refer to Japanese Patent Laid-open No. 2014-194991).

SUMMARY OF THE INVENTION

However, in a case in which the orientation of the bottom surface of the suction pad is caused to follow a surface of the target object, even when the suction is released after conveyance and the target object is separated from the suction pad, the orientation of the bottom surface of the suction pad does not return from the orientation in the conveyance to the original orientation, and it is impossible to suck and hold the next target object in some cases. The present invention is made in view of this problem and intends to provide a conveying mechanism in which the orientation of the bottom surfaces of suction pads returns to the original orientation after suction is released.

In accordance with an aspect of the present invention, there is provided a conveying mechanism that sucks and holds a target object and conveys the target object. The conveying mechanism includes a suction part that has a suction pad and sucks and holds the target object by the suction pad, a bracket connected to the suction part through a joint that is swingable, an elastic component in which one end part is fixed to the suction part and the other end part is fixed to the bracket, a negative pressure control unit that has a valve disposed on a predetermined flow path connected to the suction part and controls generation of a negative pressure at the suction part, and a movement unit that moves the bracket. The elastic component permits a swing of the suction part according to tilt or deformation of the target object that is sucked and held and, when suction holding of the target object is released, the elastic component returns an orientation of the suction pad to a predetermined orientation when the suction pad is not sucking and holding the target object.

Preferably, the elastic component is a rubber sheet, a resin sheet, an elastomer sheet, or a spring.

In accordance with another aspect of the present invention, there is provided a sheet expanding apparatus that expands a sheet stuck to a plate-shaped object. The sheet expanding apparatus includes an expanding unit that expands the sheet that is stuck to the plate-shaped object and has a rectangular shape in a predetermined planar direction and a frame disposing unit that has a first suction pad for sucking an annular frame in which an opening having a diameter larger than size of one surface of the plate-shaped object is formed, and that disposes the annular frame on a side of one surface of the sheet expanded by the expanding unit in such a manner that the annular frame surrounds the plate-shaped object. The sheet expanding apparatus includes also a cutting unit that has a cutting blade and is for cutting, by the cutting blade, outside of the opening in the sheet to which the plate-shaped object and the annular frame are stuck and a conveying mechanism that sucks and holds an outer circumferential part of a hole formed through cutting by the cutting blade in the sheet and conveys the sheet to a disposal box. The conveying mechanism includes a suction part that has a second suction pad and sucks and holds the sheet by the second suction pad, a bracket connected to the suction part through a joint that is swingable, an elastic component in which one end part is fixed to the suction part and the other end part is fixed to the bracket, a negative pressure control unit that has a valve disposed on a predetermined flow path connected to the suction part and controls generation of a negative pressure at the suction part, and a movement unit that moves the bracket. The elastic component permits a swing of the suction part according to tilt or deformation of the sheet that is sucked and held and, when suction holding of the sheet is released, the elastic component returns an orientation of the second suction pad to a predetermined orientation when the second suction pad is not sucking and holding the sheet.

Preferably, the conveying mechanism causes the sheet sucked and held by the suction part to be pressed against and bonded to the one surface of the sheet previously housed in the disposal box and then releases suction of the sheet to stack the sheet pressed and bonded on the sheet previously housed in the disposal box.

The conveying mechanism according to the aspect of the present invention includes the elastic component in which the one end part is fixed to the suction part and the other end part is fixed to the bracket. The elastic component permits a swing of the suction part according to tilt or deformation of the target object sucked and held. Moreover, when the suction holding of the target object is released, the external force that acts on the suction part from the target object disappears, and thus the orientation of the bottom surface of the suction pad is naturally returned to the original orientation due to the restoring force of the elastic component. Therefore, there is an advantage that operation in suction of the target object to be sucked next is not inhibited.

The above and other objects, features and advantages of the present invention and the manner of realizing them will become more apparent, and the invention itself will best be understood from a study of the following description and appended claims with reference to the attached drawings showing preferred embodiments of the invention.

BRIEF DESCRIPTION OF THE DRAWINGS

FIG. 5A is a partial sectional side view of a suction part and so forth;

FIG. 5B is an enlarged view of the suction part and so forth when the orientation of the bottom surface of a suction pad has changed;

DETAILED DESCRIPTION OF THE PREFERRED EMBODIMENTS

Figure 1:
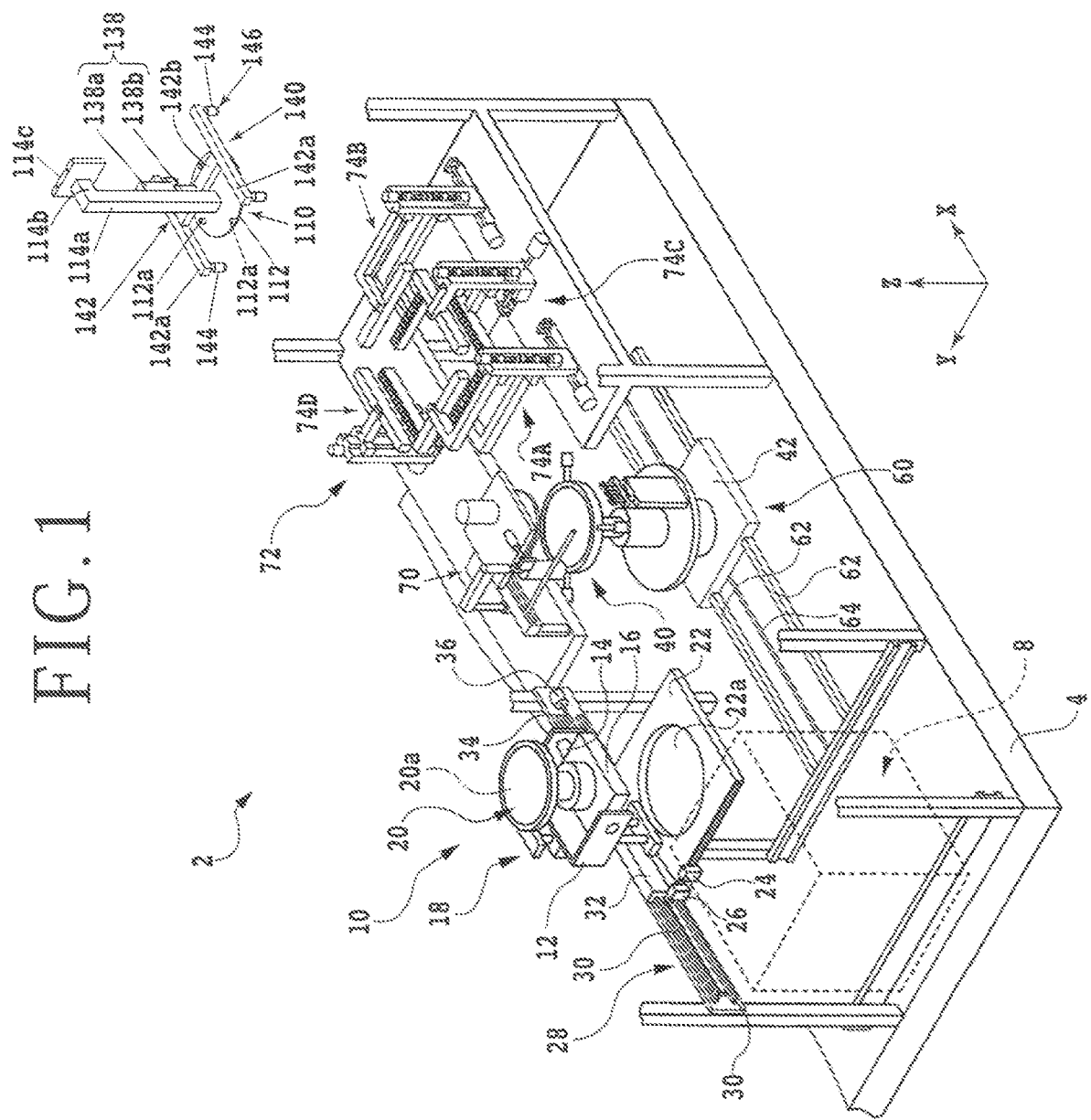
FIG. 1 is a perspective view of a sheet expanding apparatus.

Embodiments according to one aspect of the present invention will be described with reference to the accompanying drawings. FIG. 1 is a perspective view of a sheet expanding apparatus 2 according to a first embodiment. The sheet expanding apparatus 2 is an apparatus for sticking a sheet (target object) 19 that is an expanding tape having expandability/contractibility to a plate-shaped workpiece (plate-shaped object) 11 (see FIG. 2 and so forth) and thereafter expanding the sheet 19. First, the workpiece 11 and so forth will be described with reference to FIG. 2.

The workpiece 11 of the present embodiment is a wafer that is formed of a semiconductor material such as silicon and has a circular disc shape. Plural planned dividing lines 13 that intersect each other are set on the side of a front surface 11a of the workpiece 11. A device 15 such as an integrated circuit (IC) or large scale integration (LSI) is formed in each of regions marked out by the planned dividing lines 13. A protective component 17 that has substantially the same diameter as the workpiece 11 and is made of a resin is stuck to the side of the front surface 11a.

In the workpiece 11 of the present embodiment, plural modified layers are formed at different depth positions in the workpiece 11 along each planned dividing line 13. The modified layers are formed by using a laser processing apparatus (not illustrated). For example, one modified layer is formed by positioning the focal point of a laser beam having such a wavelength as to be transmitted through the workpiece 11 at a predetermined depth inside the workpiece 11 and moving the focal point along the planned dividing line 13.

Figure 2:
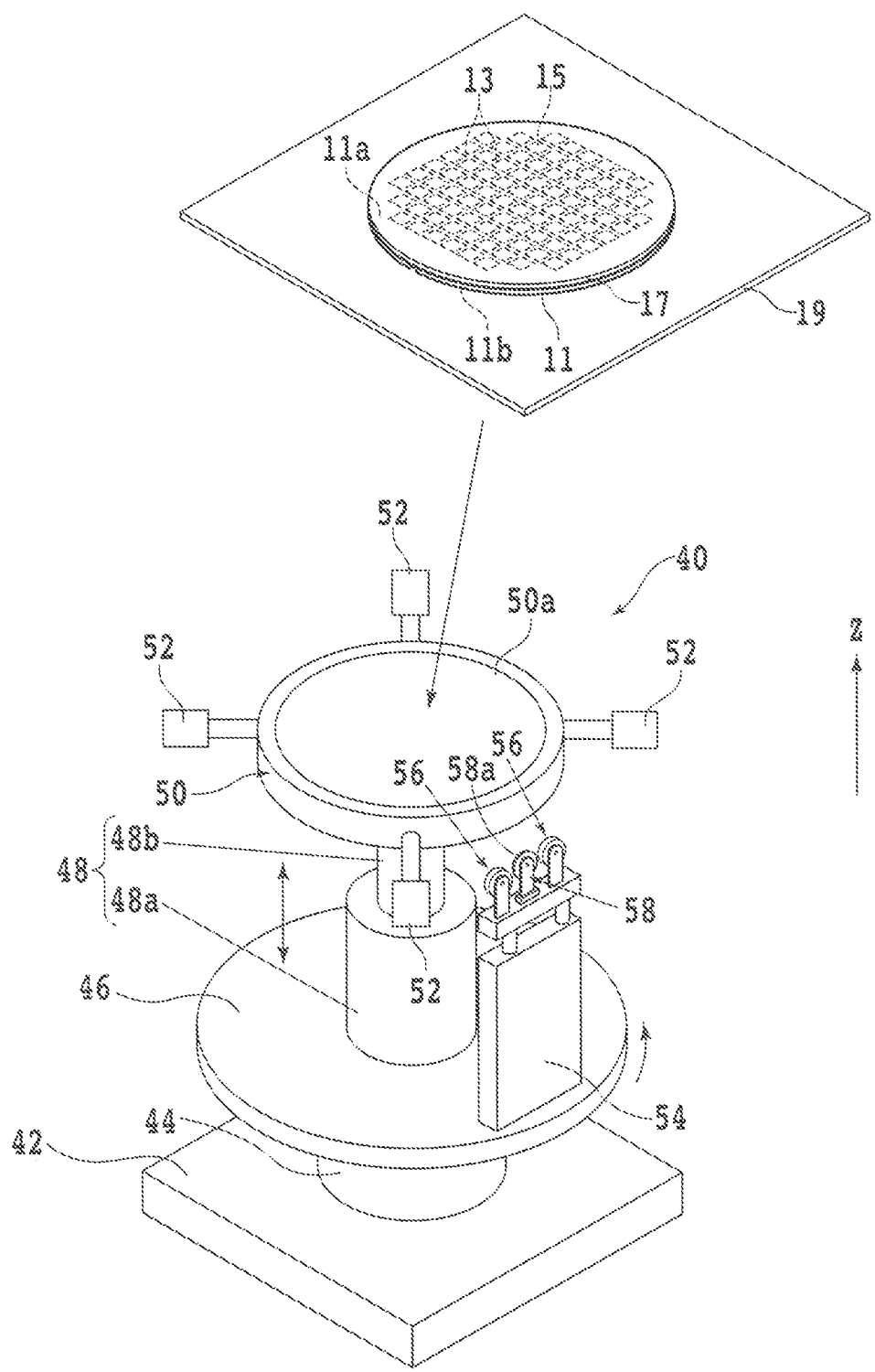
FIG. 2 is a perspective view of a transfer unit.

The workpiece 11 illustrated in FIG. 2 is in a state before the workpiece 11 is divided into plural device chips 25 (see FIG. 6 and so forth) with use of modified layers as the points of origin by applying an external force to the workpiece 11 after the plural modified layers are formed along each planned dividing line 13. The workpiece 11 is not limited to the state before it is divided and may be the state in which it has been divided into the plural device chips 25 through grinding, cutting, and so forth. Incidentally, there is no particular limit on the material, shape, structure, size, and so forth of the workpiece 11. For example, it is also possible to use a substrate composed of a semiconductor material other than silicon as the workpiece 11. Further, there is no particular limit also on the kind, quantity, shape, structure, size, arrangement, and so forth of the device 15.

Here, referring back to FIG. 1, constituent elements of the sheet expanding apparatus 2 will be described. An X-axis direction, a Y-axis direction, and a Z-axis direction illustrated in FIG. 1 are directions orthogonal to each other. The sheet expanding apparatus 2 includes a base 4 with a flat plate shape. At a corner part of the base 4 located at an end part on one side in the X-axis direction, a sheet supply unit 8 for supplying the sheet 19 to the workpiece 11 is disposed. In FIG. 1, the sheet supply unit 8 is simplified and illustrated as a rectangular parallelepiped.

In the sheet supply unit 8, a roll body (not illustrated) around which the sheet 19 with a release film is wound into a roll shape is disposed. The sheet 19 includes a base layer and an adhesive layer (glue layer) disposed on one surface side of the base layer. The base layer is formed of a resin such as a polyolefin-based resin. Further, the adhesive layer is formed of a resin such as an ultraviolet-curable resin, and the above-described release film is stuck to the adhesive layer.

The sheet supply unit 8 has a delivery roller (not illustrated) that sends out the sheet 19 with the release film from the roll body and a separation plate (not illustrated) that peels off the release film from the sheet 19 with the release film. Moreover, the sheet supply unit 8 has a take-up roller (not illustrated) that rolls up the separated release film and a sticking roller (not illustrated) that supports the base layer side of the sheet 19 from which the release film has been separated.

Over the sheet supply unit 8, a sticking unit 10 that presses the workpiece 11 against the adhesive layer side of the sheet 19 in the state in which the sticking unit sucks and holds the workpiece 11 is disposed. The sticking unit 10 includes a support part 12 including a pair of arm parts with longitudinal parts each disposed in substantially parallel to the Y-axis direction. End parts of the pair of arm parts are coupled by a coupling part disposed in substantially parallel to the X-axis direction. Further, a shaft part 14 with a circular column shape having a height direction substantially parallel to the X-axis direction is disposed between the pair of arm parts. A rotational drive source (not illustrated) such as a motor is coupled to one end part of the shaft part 14.

Between the one end part and the other end part of the shaft part 14, a base part 16 with a flat plate shape is fixed to the shaft part 14. A chuck table 20 with a circular disc shape is fixed to one surface of this base part 16. The chuck table 20 has a circular-disc-shaped porous plate connected to a suction source such as an ejector through a predetermined flow path. An upper surface 20a of the porous plate is exposed in the surface of the chuck table 20, and a negative pressure is generated at the upper surface 20a (holding surface) when the suction source is operated.

An air cylinder 18 for moving the support part 12 along the Z-axis direction is disposed on a side surface located on the opposite side to the base part 16 in the coupling part of the support part 12. The air cylinder 18 has a cylinder tube and a piston rod, and the above-described support part 12 is fixed to the upper end part of the piston rod. A rectangular plate 22 is fixed to the lower part of the air cylinder 18. The rectangular plate 22 is located directly under the chuck table 20 and has a penetration opening 22a with a diameter larger than the outer diameter of the chuck table 20.

On the side surface of the rectangular plate 22 on the one side in the X-axis direction, a cutting blade part 24 having a cutting blade for cutting the sheet 19 and a heater 26 for heating the cutting blade are disposed. The cutting blade part 24 can move along the Y-axis direction by a movement mechanism (not illustrated) disposed on the rectangular plate 22. An X-axis movement mechanism 28 of a ball screw type for moving the sticking unit 10 in the X-axis direction is disposed at an end part of the rectangular plate 22 on one side in the Y-axis direction. The X-axis movement mechanism 28 has a pair of guide rails 30 that are substantially parallel to the X-axis direction and are disposed to overlap in the Z-axis direction.

A moving plate 32 is attached to each guide rail 30 movably in the X-axis direction. A nut part (not illustrated) is disposed on the back surface side of the moving plate 32, and a ball screw 34 substantially parallel to the X-axis direction is rotatably coupled to this nut part. A rotational drive source 36 such as a motor is coupled to one end part of the ball screw 34.

Here, the procedure of sticking the sheet 19 to the side of a back surface 11b of the workpiece 11 will be briefly described. First, the sticking unit 10 is disposed above the sheet supply unit 8. Then, in the state in which the upper surface 20a of the chuck table 20 is oriented upward, the side of the front surface 11a of the workpiece 11 is sucked and held by the upper surface 20a. Thereafter, the shaft part 14 is rotated, and the upper surface 20a is oriented downward. Then, by operating the air cylinder 18 and moving the upper surface 20a downward, the adhesive layer of the sheet 19 is stuck to the whole of the side of the back surface 11b of the workpiece 11. Next, the sheet 19 is cut by moving the cutting blade part 24 along the Y-axis direction, and thereafter the sticking unit 10 is moved to the other side in the X-axis direction. Thereby, the sheet 19 is cut off into a substantially square (rectangle), and the protective component 17, the workpiece 11, and the sheet 19 are integrated (see FIG. 2).

The workpiece 11 to which the sheet 19 is stuck is transferred to a transfer unit 40 disposed below the sticking unit 10. FIG. 2 is a perspective view of the transfer unit 40. The transfer unit 40 has a rectangular moving plate 42. A rotational drive source 44 such as a motor is disposed on the moving plate 42. An output shaft (not illustrated) of the rotational drive source 44 is disposed in substantially parallel to the Z-axis direction, and the central part of the lower surface of a circular disc 46 is fixed to this output shaft.

An air cylinder 48 is disposed at the central part of the upper surface of the circular disc 46. The air cylinder 48 has a circular-column-shaped cylinder tube 48a disposed in substantially parallel to the Z-axis direction. The lower part of a piston rod 48b is disposed inside the cylinder tube 48a. The lower part of a chuck table 50 is fixed to the upper end part of the piston rod 48b. The structure of the chuck table 50 is substantially the same as that of the above-described chuck table 20. A holding surface 50a at which a negative pressure is generated is exposed in the upper surface of the chuck table 50.

On the side surface of the chuck table 50, a clamp mechanism 52 for clamping the four corners of the sheet 19 is disposed at each of four places different in the circumferential direction of the chuck table 50. A support post 54 with a rectangular parallelepiped shape is disposed between the two clamp mechanisms 52 in the circumferential direction of the chuck table 50. The lower end part of the support post 54 is fixed to the upper surface of the circular disc 46.

Two roller parts 56 are disposed at the upper end part of the support post 54. Each roller part 56 is used when an annular frame 23 to be described later is stuck to the sheet 19.

An air cylinder (not illustrated) is disposed at the lower part of each roller part 56, and the height of each roller part 56 is adjusted by this air cylinder. A cutting unit 58 having a circular annular cutting blade 58a is disposed between the two roller parts 56. An air cylinder (not illustrated) is disposed also at the lower part of the cutting unit 58. The height of the upper end of the cutting blade 58a is adjusted by this air cylinder. As illustrated in FIG. 1, an X-axis movement mechanism 60 is coupled to the lower part of the moving plate 42 of the transfer unit 40.

The X-axis movement mechanism 60 has a pair of guide rails 62 disposed in substantially parallel to the X-axis direction. The moving plate 42 is attached onto the guide rails 62 movably in the X-axis direction. A nut part (not illustrated) is disposed on the back surface side of the moving plate 42. A ball screw 64 substantially parallel to the X-axis direction is rotatably coupled to the nut part. A rotational drive source (not illustrated) such as a motor is coupled to one end part of the ball screw 64. Incidentally, a separation mechanism 70 for separating the protective component 17 stuck to the side of the front surface 11a of the workpiece 11 is disposed on the upper side relative to the transfer unit 40.

Figure 3:
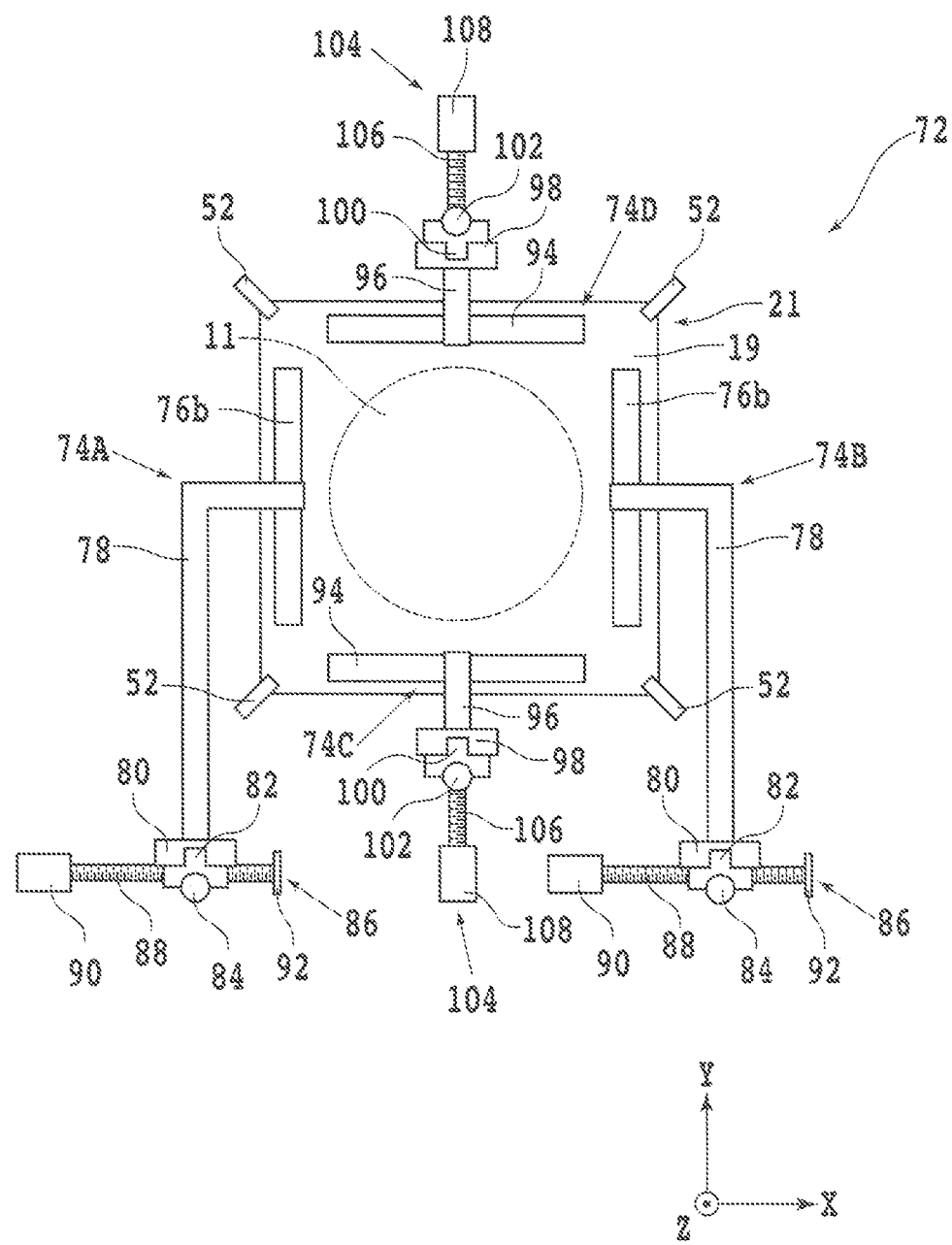
FIG. 3 is a top view of an expanding unit.

When the protective component 17 on the side of the front surface 11a is separated by the separation mechanism 70 after the sheet 19 is stuck to the side of the back surface 11b, a workpiece unit 21 composed of the workpiece 11 and the sheet 19 is formed (see FIG. 3 and so forth). As illustrated in FIG. 1, an expanding unit 72 is disposed on the other side in the X-axis direction relative to the separation mechanism 70 and over the transfer unit 40. The expanding unit 72 expands the sheet 19 of the workpiece unit 21 held by the transfer unit 40 along the XY-plane direction (predetermined planar direction).

The expanding unit 72 will be described with reference mainly to FIG. 3. FIG. 3 is a top view of the expanding unit 72. The expanding unit 72 has a first clamping unit 74A that clamps the sheet 19. The first clamping unit 74A has a lower clamping part 76a (see FIG. 6) and an upper clamping part 76b each having a longitudinal part along the Y-axis direction. Plural rollers $76a_1$ (see FIG. 6) are disposed along the Y-axis direction on the upper surface side of the lower clamping part 76a. Each roller $76a_1$ can rotate around a rotation axis substantially parallel to the X-axis direction, and substantially half of the roller $76a_1$ in the radial direction protrudes upward from the upper surface of the lower clamping part 76a. Similarly, plural rollers $76b_1$ (see FIG. 6) are disposed along the Y-axis direction on the lower surface side of the upper clamping part 76b. Each roller $76b_1$ can rotate around a rotation axis substantially parallel to the X-axis direction, and substantially half of the roller $76b_1$ in the radial direction protrudes downward from the lower surface of the upper clamping part 76b.

One end part of a lower arm (not illustrated in FIG. 3) with a substantially L-shape in bottom view is coupled to a substantially central part of the lower clamping part 76a. Also to a substantially central part of the upper clamping part 76b, similarly, one end part of an upper arm 78 with a substantially L-shape in bottom view is coupled. A lower movable plate (not illustrated in FIG. 3) is coupled to the other end part of the lower arm, and an upper movable plate 80 is coupled to the other end part of the upper arm 78. The lower movable plate and the upper movable plate 80 are attached, movably in the Z-axis direction, to a guide rail 82 disposed in substantially parallel to the Z-axis direction.

A nut part is disposed on the opposite side to the lower arm (back surface side) in the lower movable plate, and a nut part is disposed also on the opposite side to the upper arm 78 (back surface side) in the upper movable plate 80 (neither is illustrated in FIG. 3). A ball screw (not illustrated in FIG. 3) substantially parallel to the Z-axis direction is rotatably coupled to the nut part of the lower movable plate, and a rotational drive source (not illustrated in FIG. 3) such as a motor is coupled to the lower end part of this ball screw. Similarly, a ball screw (not illustrated in FIG. 3) substantially parallel to the Z-axis direction is rotatably coupled to the nut part of the upper movable plate 80, and a rotational drive source 84 such as a motor is coupled to the upper end part of this ball screw.

When the lower arm is raised by operating the rotational drive source and the upper arm 78 is lowered by operating the rotational drive source 84, the sheet 19 can be clamped by the plural rollers $76a_1$ of the lower clamping part 76a and the plural rollers $76b_1$ of the upper clamping part 76b. The guide rail 82 is fixed to one surface of a base part with a rectangular parallelepiped shape, and an X-axis movement mechanism 86 for moving the first clamping unit 74A along the X-axis direction is disposed at the lower part of this base part.

The X-axis movement mechanism 86 has a nut part (not illustrated) disposed at the lower part of the base part and a ball screw 88 that is rotatably coupled to this nut part and is substantially parallel to the X-axis direction. A rotational drive source 90 such as a motor is coupled to one end part of the ball screw 88. Further, a bearing 92 is coupled to the other end part of the ball screw 88. When the first clamping unit 74A is moved to the one side in the X-axis direction in the state in which the sheet 19 is clamped by the lower clamping part 76a and the upper clamping part 76b, the sheet 19 is pulled to the one side in the X-axis direction.

When the expanding unit 72 is viewed in top view, a second clamping unit 74B is disposed on the opposite side to the first clamping unit 74A with respect to a straight line (first line symmetry axis) that passes through the center of the expanding unit 72 in the X-axis direction and is parallel to the Y-axis direction. The configuration of the second clamping unit 74B is basically the same as that of the first clamping unit 74A. However, the lower arm and the upper arm 78 of the second clamping unit 74B are disposed line-symmetrically with respect to the lower arm and the upper arm 78 of the first clamping unit 74A about the first line symmetry axis.

When the second clamping unit 74B is moved to the other side in the X-axis direction by using the X-axis movement mechanism 86 for the second clamping unit 74B in the state in which the sheet 19 is clamped by the lower clamping part 76a and the upper clamping part 76b of the second clamping unit 74B, the sheet 19 is pulled to the other side in the X-axis direction. Between the first clamping unit 74A and the second clamping unit 74B, a third clamping unit 74C is disposed closer to the other side in the Y-axis direction than the end parts of the upper clamping parts 76b on the other side in the Y-axis direction. The third clamping unit 74C has a lower clamping part (not illustrated in FIG. 3) and an upper clamping part 94 each having a longitudinal part along the X-axis direction.

Plural rollers (not illustrated in FIG. 3) are disposed along the X-axis direction on the upper surface side of the lower clamping part. Each roller can rotate around a rotation axis substantially parallel to the Y-axis direction, and substantially half of the roller in the radial direction protrudes upward from the upper surface of the lower clamping part. Similarly, plural rollers (not illustrated) are disposed along the X-axis direction on the lower surface side of the upper clamping part 94. Each roller can rotate around a rotation axis substantially parallel to the Y-axis direction, and substantially half of the roller in the radial direction protrudes downward from the lower surface of the upper clamping part 94.

One end part of a lower arm (not illustrated) with a straight line shape is coupled to a subsequently central part of the lower clamping part in such a manner that the lower arm extends to the other side in the Y-axis direction. Also to a substantially central part of the upper clamping part 94, one end part of an upper arm 96 with a straight line shape is coupled in such a manner that the upper arm 96 extends to the other side in the Y-axis direction. A lower movable plate (not illustrated) is coupled to the other end part of the lower arm, and an upper movable plate 98 is coupled to the other end part of the upper arm 96. The lower movable plate and the upper movable plate 98 are attached, movably in the Z-axis direction, to a guide rail 100 disposed in substantially parallel to the Z-axis direction.

A nut part is disposed on the opposite side to the lower arm (back surface side) in the lower movable plate, and a nut part is disposed also on the opposite side to the upper arm 96 (back surface side) in the upper movable plate 98 (neither is illustrated). A ball screw (not illustrated) substantially parallel to the Z-axis direction is rotatably coupled to the nut part of the lower movable plate, and a rotational drive source (not illustrated) such as a motor is coupled to the lower end part of this ball screw. Similarly, a ball screw (not illustrated) substantially parallel to the Z-axis direction is rotatably coupled to the nut part of the upper movable plate 98, and a rotational drive source 102 such as a motor is coupled to the upper end part of this ball screw.

When the lower arm is raised by operating the rotational drive source for the lower clamping part and the upper arm 96 is lowered by operating the rotational drive source 102, the sheet 19 can be clamped by each roller of the lower clamping part and each roller of the upper clamping part 94. The guide rail 100 is fixed to one surface of a base part with a rectangular parallelepiped shape, and a Y-axis movement mechanism 104 for moving the third clamping unit 74C along the Y-axis direction is disposed at the lower part of this base part.

The Y-axis movement mechanism 104 has a nut part (not illustrated) disposed at the lower part of the base part and a ball screw 106 that is rotatably coupled to this nut part and is parallel to the Y-axis direction. A rotational drive source 108 such as a motor is coupled to one end part of the ball screw 106. A bearing is coupled to the other end part of the ball screw 106. When the third clamping unit 74C is moved to the other side in the Y-axis direction in the state in which the sheet 19 is clamped by the lower clamping part and the upper clamping part 94, the sheet 19 is pulled to the other side in the Y-axis direction.

A fourth clamping unit 74D is disposed on the opposite side to the third clamping unit 74C with respect to the lower clamping part 76a and the upper clamping part 76b of the first clamping unit 74A. The configuration of the fourth clamping unit 74D is substantially the same as that of the third clamping unit 74C. However, one end part of a lower arm (not illustrated) with a straight line shape is coupled to the lower clamping part in such a manner that the lower arm extends to the one side in the Y-axis direction. Also to the upper clamping part 94, one end part of the upper arm 96 with a straight line shape is coupled in such a manner that the upper arm 96 extends to the one side in the Y-axis direction.

When the fourth clamping unit 74D is moved to the one side in the Y-axis direction in the state in which the sheet 19 is clamped by the lower clamping part and the upper clamping part 94 of the fourth clamping unit 74D, the sheet 19 is pulled to the one side in the Y-axis direction. Referring back to FIG. 1, other constituent elements of the sheet expanding apparatus 2 will be described. On the one side of the expanding unit 72 in the Y-axis direction, a frame stock region (not illustrated) in which the annular frames 23 (see FIG. 7) made of a metal are disposed to be stacked in the Z-axis direction exists. The annular frame 23 is a ring-shaped thin plate and has a penetration opening (opening) 23a having a diameter larger than the diameter (size) of the front surface 11a or the back surface 11b (i.e., one surface) of the workpiece 11 (see FIG. 7).

Over the base 4, a frame disposing unit 110 is disposed. The frame disposing unit 110 conveys one annular frame 23 in the state in which the frame disposing unit 110 sucks and holds the annular frame 23 and disposes it on the side of one surface 19a (i.e., surface on the adhesive layer side in the sheet 19, see FIG. 7) of the sheet 19 expanded by the expanding unit 72. The frame disposing unit 110 includes a base part 112 that has a circular disc shape in top view and is made of a metal. On the lower surface side of the base part 112, four suction pads (first suction pads) 112a are disposed in such a manner as to be separated from each other along the circumferential direction of the base part 112.

The suction pads 112a of the present embodiment are pads used in a suction mechanism of a vacuum system. To the suction pads 112a, the other end of a flow path (not illustrated) with one end connected to a suction source (not illustrated) such as a vacuum pump or ejector is connected. A valve (not illustrated) such as a solenoid valve is disposed on this flow path. When the valve is set to the opened state, a negative pressure is generated on the bottom surface side of the suction pads 112a. The suction pads 112a are not limited to the vacuum system and may be pads used in a suction mechanism of a Bernoulli system (i.e. Bernoulli chuck). In the case of the Bernoulli system, at the one end of the flow path, a gas supply source for supplying a gas such as air is disposed instead of the suction source. Instead of the independent plural suction pads 112a, an annular suction pad may be disposed on the lower surface side of the base part 112.

Figure 4A:
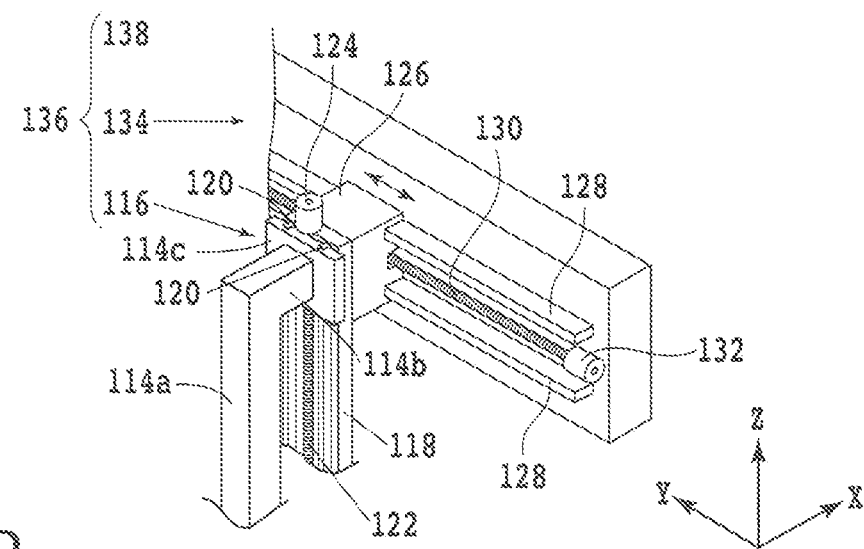
FIG. 4A is a perspective view of a Z-axis direction movement mechanism and so forth.

The lower end part of a support column 114a with a rectangular column shape having a longitudinal part along the Z-axis direction is connected to the upper surface of the base part 112. One end part of a connecting part 114b with a rectangular column shape that extends along the X-axis direction is connected to the upper end part of the support column 114a. One surface (front surface) of a rectangular moving plate 114c is connected to the other end part of the connecting part 114b. A Z-axis direction movement mechanism 116 is disposed on the side of the other surface (back surface) of the moving plate 114c. FIG. 4A is a perspective view of the Z-axis direction movement mechanism 116 and so forth.

The Z-axis direction movement mechanism 116 has a flat-plate-shaped moving plate 118 with a longitudinal part disposed along the Z-axis direction. A pair of guide rails 120 disposed along the Z-axis direction are fixed to one surface (front surface) of the moving plate 118. The above-described moving plate 114c is disposed on the pair of guide rails 120 movably along the Z-axis direction. A nut part (not illustrated) is disposed on the back surface side of the moving plate 114c, and a ball screw 122 disposed along the pair of guide rails 120 is rotatably coupled to this nut part.

A rotational drive source 124 such as a motor is disposed at the upper end part of the ball screw 122. The moving plate 118, the guide rails 120, the ball screw 122, the rotational drive source 124, and so forth configure the Z-axis direction movement mechanism 116 that moves the support column 114a along the Z-axis direction. The side of one surface (front surface) of a moving block 126 is fixed to the side of the other surface (back surface) of the moving plate 118. The moving block 126 is movably attached to a pair of guide rails 128 that are substantially parallel to the Y-axis direction and are disposed to overlap in the Z-axis direction.

A nut part (not illustrated) is disposed on the side of the other surface (back surface) of the moving block 126, and a ball screw 130 disposed in substantially parallel to the Y-axis direction between the pair of guide rails 128 is rotatably coupled to this nut part. A rotational drive source 132 such as a motor is coupled to one end part of the ball screw 130. The moving block 126, the guide rails 128, the ball screw 130, the rotational drive source 132, and so forth configure a Y-axis movement mechanism 134 that moves the support column 114a and so forth along the Y-axis direction.

As illustrated in FIG. 1, an air cylinder 138 is fixed to a side surface of the support column 114a. The air cylinder 138 has a cylinder tube 138a with the longitudinal direction disposed along the Z-axis direction. The upper part of a piston 138b is disposed inside the cylinder tube 138a. A conveying mechanism 140 is fixed to the lower part of the piston 138b. The Z-axis direction movement mechanism 116, the Y-axis movement mechanism 134, and the air cylinder 138 configure a movement unit 136 (see FIG. 4A) for moving the conveying mechanism 140 along the Z-axis direction and the Y-axis direction.

Figure 4B:
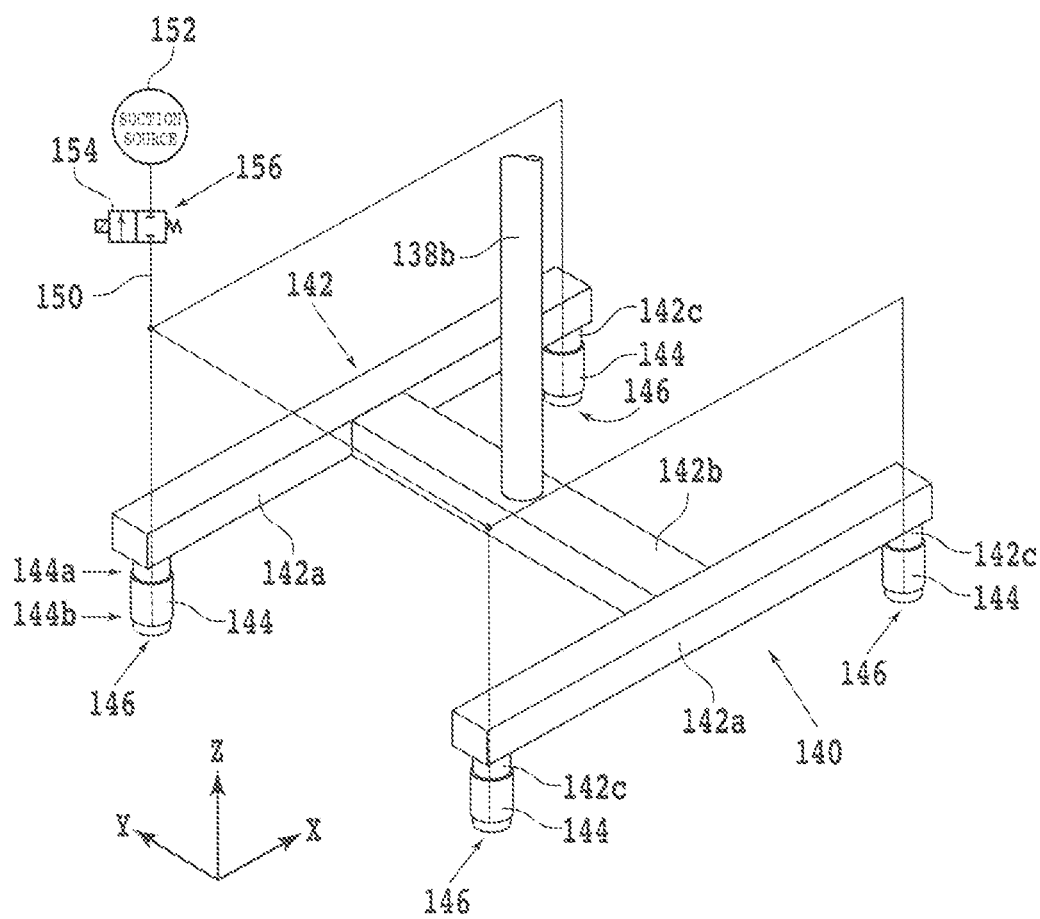
FIG. 4B is a perspective view of a conveying mechanism.

FIG. 4B is a perspective view of the conveying mechanism 140 that sucks and holds the sheet 19 (target object) and conveys the sheet 19. In FIG. 4B, some of constituent elements is illustrated in a simplified manner by lines, functional blocks, and so forth. The conveying mechanism 140 includes a bracket 142 that has a substantially H-shape in top view and is made of a metal. The bracket 142 includes a pair of straight line parts 142a disposed in substantially parallel to the X-axis direction. Middle parts of the pair of straight line parts 142a in the longitudinal direction are coupled by a coupling part 142b disposed in substantially parallel to the Y-axis direction.

Cylindrical parts 142c are formed at the lower parts of both end parts of the straight line parts 142a. The cylindrical parts 142c are part of the bracket 142. Flow paths are formed in the cylindrical parts 142c, and one end of a hose, a tube (neither is illustrated), or the like that configures a flow path 150 (predetermined flow path) is connected to the upper part of the cylindrical part 142c. A suction source 152 such as a vacuum pump or ejector is connected to the other end of the flow path 150. Further, a valve 154 such as a solenoid valve controlled by a control unit to be described later is disposed on the flow path 150.

Upper end parts (the other end parts) 144a of elastic components 144 are fixed to the outer circumferential side surfaces of the cylindrical parts 142c on the bottom part side. The elastic components 144 of the present embodiment are elastic sheets formed into a cylindrical shape by using an elastic material. As the elastic material, for example, rubber such as natural rubber or synthetic rubber, a polyolefin-based resin such as polyethylene (PE), polypropylene (PP), or polystyrene (PS), a polyester-based resin such as polyethylene terephthalate (PET), or an elastomer is used. The shape of the elastic components 144 is not limited to the cylindrical shape and may be a strip shape. That is, the elastic components 144 may be rubber sheets, resin sheets, elastomer sheets, or the like with the cylindrical shape or the strip shape.

When the shape of the elastic components 144 is the strip shape, plural strip-shaped sheets are discretely disposed in the circumferential direction of the cylindrical parts 142c. Further, the elastic components 144 may be not sheets with the cylindrical shape or the strip shape but springs. In a case of using springs as the elastic components 144, plural springs are discretely disposed in the circumferential direction of the cylindrical parts 142c. As each spring, any of various springs such as coil spring and thin leaf spring may be used. The material and shape of the elastic components 144 are not limited to the above-described examples as long as they can exert a restoring force in the XY-plane direction.

The outer circumferential side surfaces of suction parts 146 with a circular column shape are fixed to lower end parts (one end parts) 144b of the elastic components 144. FIG. 5A is a partial sectional side view of the suction part 146 and so forth. In FIG. 5A, part of the cylindrical part 142c, the elastic component 144, and the suction part 146 is illustrated in a section. As illustrated in FIG. 5A, a joint 148 is connected to the bottom part of the cylindrical part 142c in such a manner as to be swingable in a predetermined solid angle range, and the central part of the upper part of the suction part 146 is fixed to the lower part of the joint 148.

A flow path 146a is formed in the suction part 146 and is connected to a suction pad (second suction pad) 146b disposed in such a manner that a holding surface at which a negative pressure is generated is oriented downward. In FIG. 5A, the side surface of the suction pad 146b is illustrated. Although the suction pad 146b itself is formed of rubber or the like, the surface of the suction pad 146b is covered by a releasing agent of polytetrafluoroethylene or the like. Therefore, the suction pad 146b easily gets separated from the sheet 19 even after getting contact with the adhesive layer of the sheet 19.

The flow path 146a is connected to the other end part of the flow path 150 in the bracket 142 through a flow path 148a of the joint 148. For the suction pad 146b, generation of a negative pressure is controlled by a negative pressure control unit 156 including the valve 154 and so forth. For example, when the valve 154 is set to the opened state, the suction pad 146b communicates with the suction source 152, and a negative pressure is generated at the suction pad 146b. Further, when the valve 154 is set to the closed state, the suction pad 146b and the suction source 152 are disconnected, and the transmission of the negative pressure from the suction source 152 to the suction pad 146b is interrupted.

The suction pad 146b of the present embodiment is a pad used in a suction mechanism of a vacuum system. However, the suction pad 146b is not limited thereto and may be a pad used in a suction mechanism of a Bernoulli system. In the case of the Bernoulli system, at one end of the flow path 150, a gas supply source for supplying a gas such as air is disposed instead of the suction source 152. For example, the gas supply source has a compressor that compresses air, a tank in which the compressed air is accumulated, and a filter that removes water drops and dust in the air. When the valve 154 is set to the opened state, the gas is supplied from the gas supply source to the suction pad 146b. When the suction pad 146b jets the gas to the outside of the circular bottom surface in the radial direction or jets the gas in such a manner that a swirling flow is generated under the bottom surface, the pressure lowers and a negative pressure is generated in accordance with the Bernoulli principle in the vicinity of the central part of the bottom surface of the suction pad 146b.

Next, the joint 148 will be described in more detail. The joint 148 has a spherical part 148b made of a metal. A cylindrical part 148c is fixed to the lower part of the spherical part 148b. The flow path 148a having a diameter smaller than the diameter of the flow path 150 is formed in the spherical part 148b and the cylindrical part 148c in such a manner as to penetrate both. The spherical part 148b is held by the bottom part of the cylindrical part 142c in such a manner as to be restricted from being translated along the X-axis, Y-axis, and Z-axis directions but being rotatable in any direction as long as the flow path 148a communicates with the flow path 150.

A structure that enables the rotation of such a spherical part 148b is described in the above-described Japanese Patent Laid-open No. 2014-194991, for example. In association with the rotation of the spherical part 148b, the joint 148 and the suction part 146 can integrally swing (that is, swing is permitted). For example, when the joint 148 is viewed in any direction orthogonal to the Z-axis direction, the joint 148 can swing in a range from +15 degrees to −15 degrees with respect to the Z-axis direction. Therefore, even when deformation, tilt, or the like of the sheet 19 occurs in a case in which the suction pad 146b sucks and holds the sheet 19, the orientation of the bottom surface of the suction pad 146b can change to follow the surface of the sheet 19.

FIG. 5B is an enlarged view of the suction part 146 and so forth when the orientation of the bottom surface of the suction pad 146b has changed from a predetermined orientation A1 parallel to the Z-axis direction to an orientation A2 different from the orientation A1. When the suction holding of the sheet 19 is released, the external force that acts on the suction part 146 from the sheet 19 disappears. Therefore, due to the restoring force of the elastic component 144, the joint 148 and the suction part 146 swing, and the orientation of the bottom surface of the suction pad 146b returns to the original predetermined orientation A1 when the sheet 19 is not being sucked and held (i.e., state of FIG. 5A). Accordingly, the conveying mechanism 140 of the present embodiment has an advantage that operation in suction of the sheet 19 to be sucked next is not inhibited.

Figure 11:
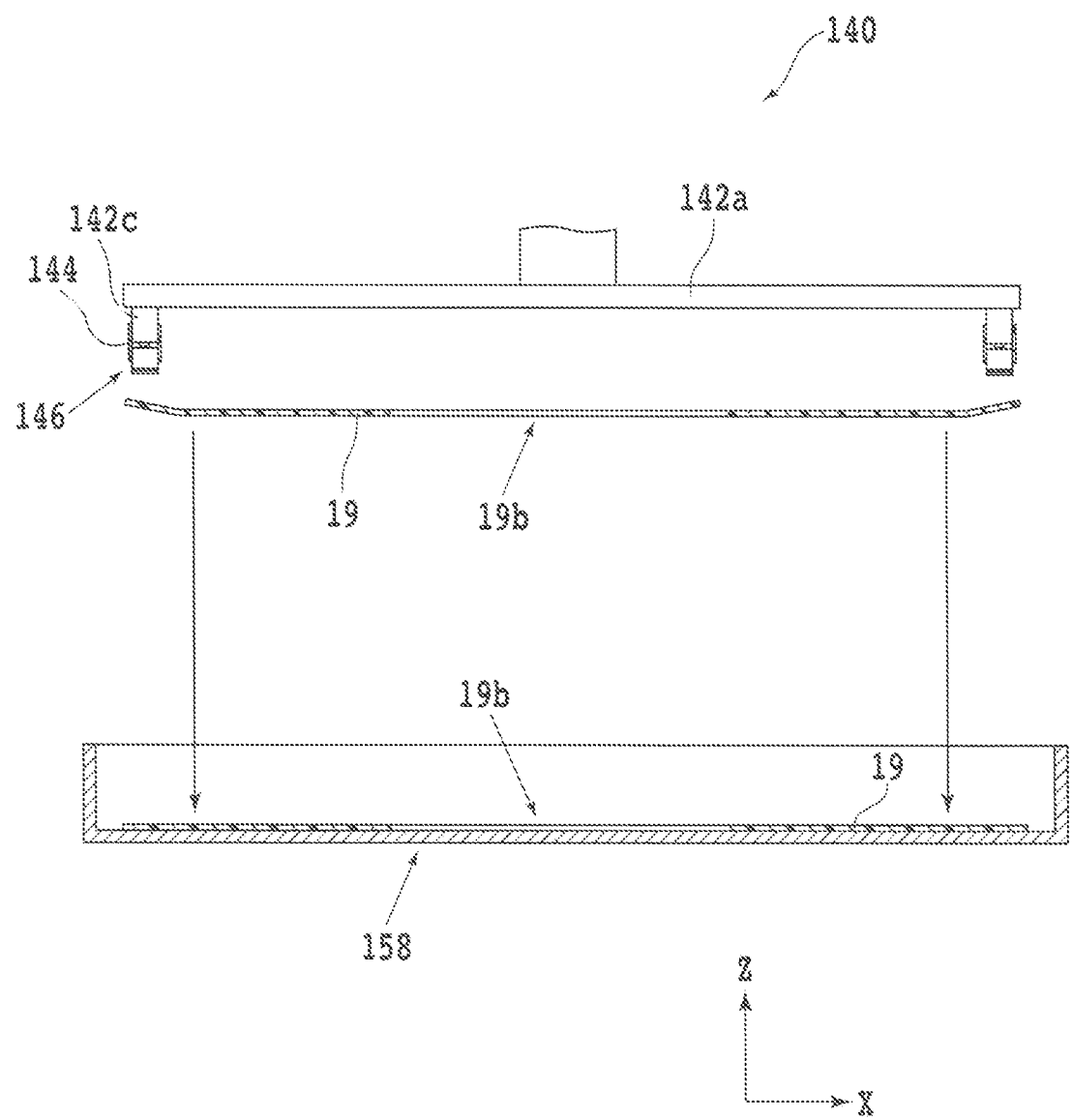
FIG. 11 is a diagram illustrating a sheet disposal step.
Figure 12:
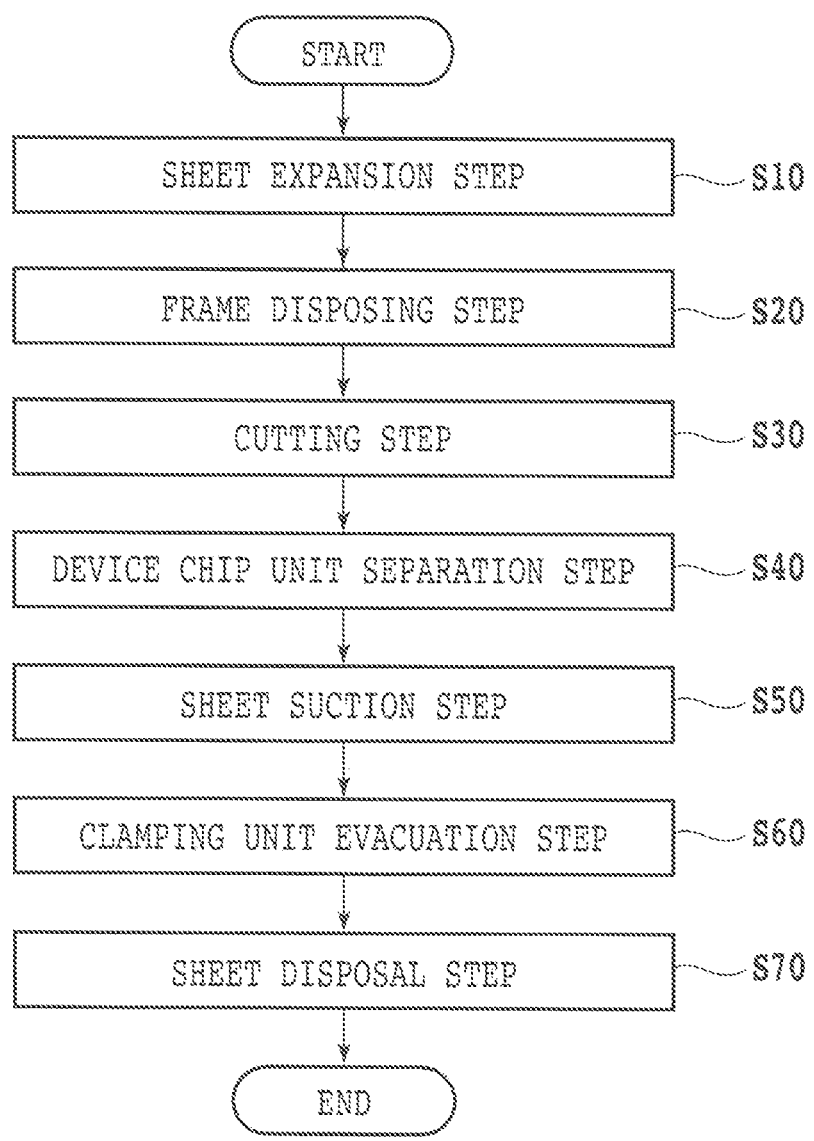
FIG. 12 is a flowchart illustrating a processing method of a sheet.

Incidentally, the sheet expanding apparatus 2 is equipped with a control unit (not illustrated) that controls operation of the respective rotational drive sources, the respective suction sources, the valve 154, and so forth. For example, the control unit is configured by a computer including a processing device such as a processor typified by a central processing unit (CPU), a main storing device such as a dynamic random access memory (DRAM), a static random access memory (SRAM), or a read only memory (ROM), and an auxiliary storing device such as a flash memory, a hard disk drive, or a solid state drive. Software including a predetermined program is stored in the auxiliary storing device. Functions of the control unit are implemented by operating the processing device and so forth according to this software. Next, operation of the sheet expanding apparatus 2 will be described by using FIG. 6 to FIG. 12 mainly. FIG. 12 is a flowchart illustrating a processing method of the sheet 19 with use of the sheet expanding apparatus 2.

In the transfer unit 40, the workpiece unit 21 is sucked and held in the state in which the four corners of the sheet 19 are clamped by the clamp mechanisms 52. First, this transfer unit 40 is moved to the lower side of the expanding unit 72. Then, the chuck table 50 of the transfer unit 40 is raised by the air cylinder 48, and the workpiece unit 21 is moved to substantially the same height as the first clamping unit 74A to the fourth clamping unit 74D.

Figure 6:
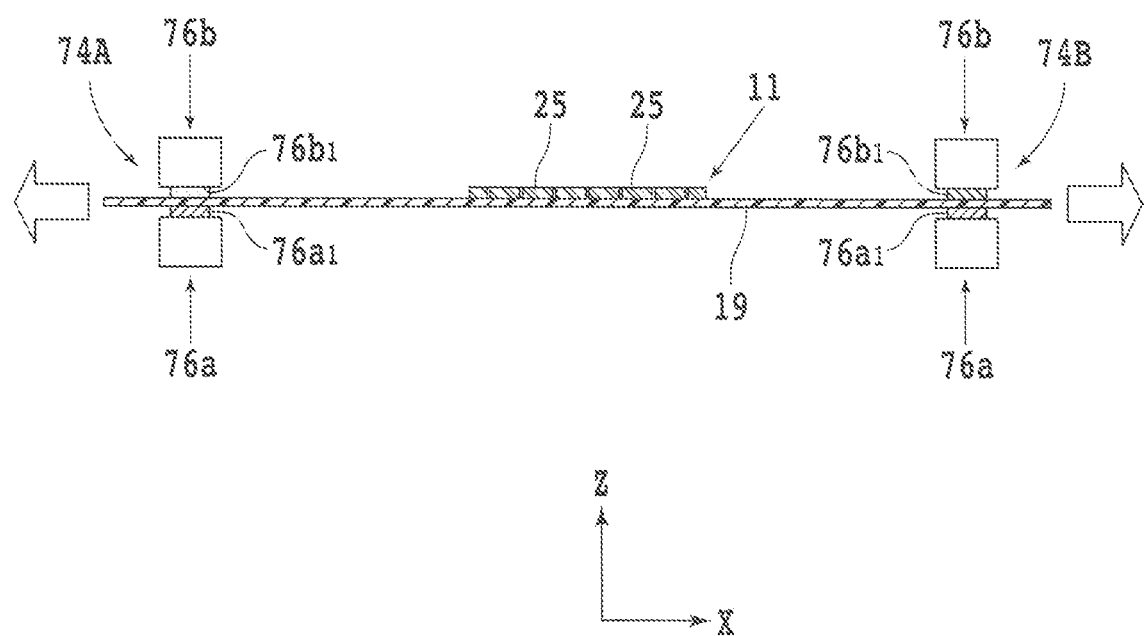
FIG. 6 is a diagram illustrating a sheet expansion step.

After the four sides of the sheet 19 are clamped by the first clamping unit 74A to the fourth clamping unit 74D, the suction by the chuck table 50 is released, and the chuck table 50 is evacuated downward. Next, the first clamping unit 74A to the fourth clamping unit 74D expand the sheet 19 along the XY-plane direction. In association with the expansion of the sheet 19, an external force is applied to the workpiece 11, and the workpiece 11 is divided into plural device chips 25 with modified layers being the points of origin (sheet expansion step S10). FIG. 6 is a diagram illustrating the sheet expansion step S10.

Figure 7:
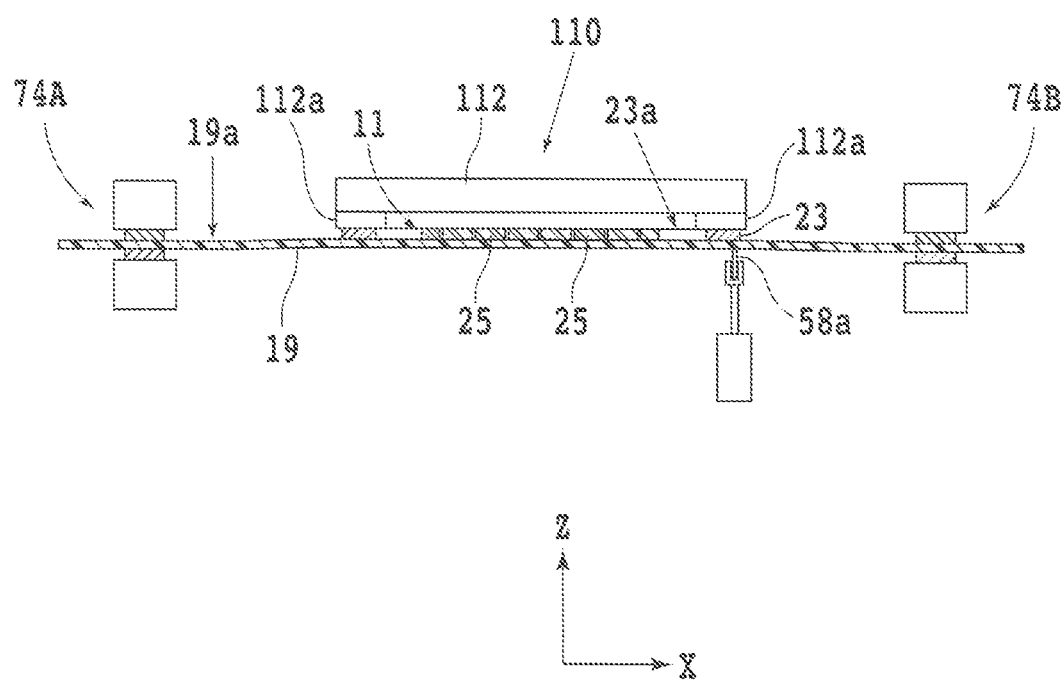
FIG. 7 is a diagram illustrating a frame disposing step and a cutting step.

Next, as illustrated in FIG. 7, one surface side of the annular frame 23 is sucked and held by the suction pads 112*a* of the frame disposing unit 110, and the annular frame 23 is conveyed to dispose the annular frame 23 on the adhesive layer side of the expanded sheet 19 (frame disposing step S20). The annular frame 23 is disposed to surround the workpiece 11 after the dividing (that is, whole of the device chips 25). Then, after the two roller parts 56 of the transfer unit 40 are raised, the rotational drive source 44 is operated, and the support post 54 is rotated in a predetermined direction. Thereby, the annular frame 23 is surely stuck to the sheet 19.

Thereafter, the two roller parts 56 are lowered. Instead, the cutting unit 58 is raised, and the cutting blade 58*a* is made to cut into a region located outside the penetration opening 23*a* and directly under the annular frame 23 in the sheet 19. Then, the support post 54 is rotated in a predetermined direction. Thereby, the sheet 19 is cut into a circular shape along the locus of the upper end of the cutting blade 58*a* (cutting step S30). FIG. 7 is a diagram illustrating the frame disposing step S20 and the cutting step S30. In FIG. 7, the conveying mechanism 140 is omitted.

Figure 8:
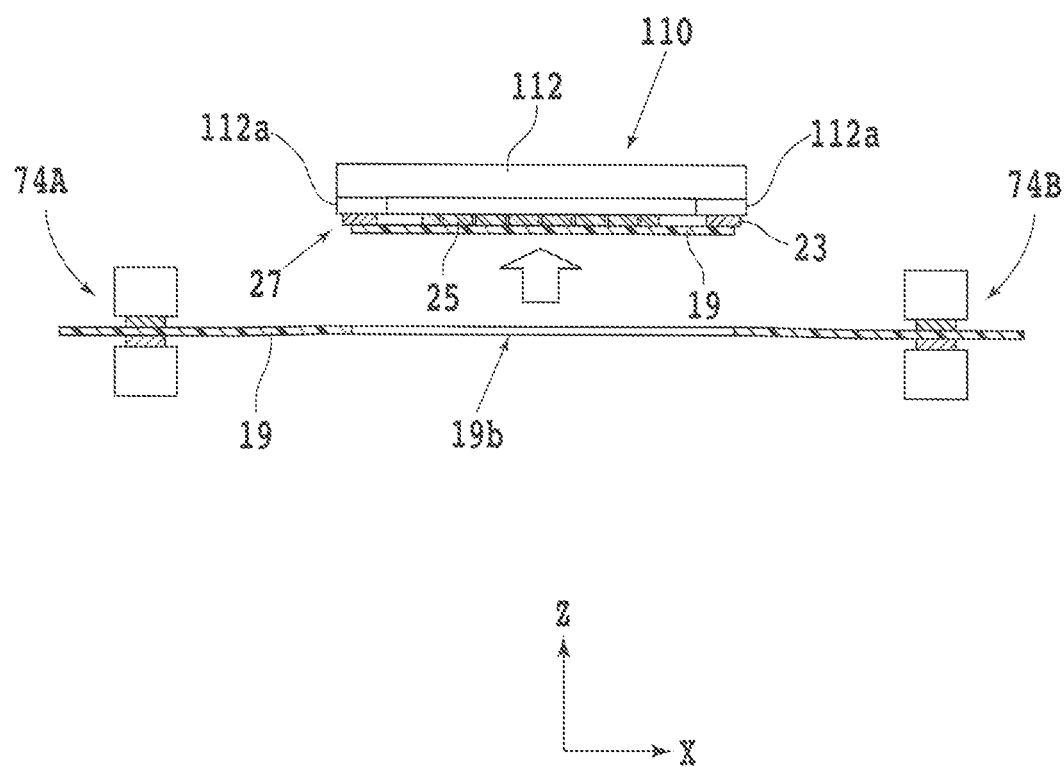
FIG. 8 is a diagram illustrating a device chip unit separation step.

By the cutting step S30, a device chip unit 27 in which the circular sheet 19, the annular frame 23, and the plural device chips 25 are integrated is formed (see FIG. 8). Further, a hole 19*b* that accompanies the cutting step S30 is formed in the sheet 19 (see FIG. 8). Next, the Z-axis direction movement mechanism 116 is operated, and the frame disposing unit 110 is moved upward. Thereby, the device chip unit 27 is separated from the sheet 19 (device chip unit separation step S40).

Figure 9:
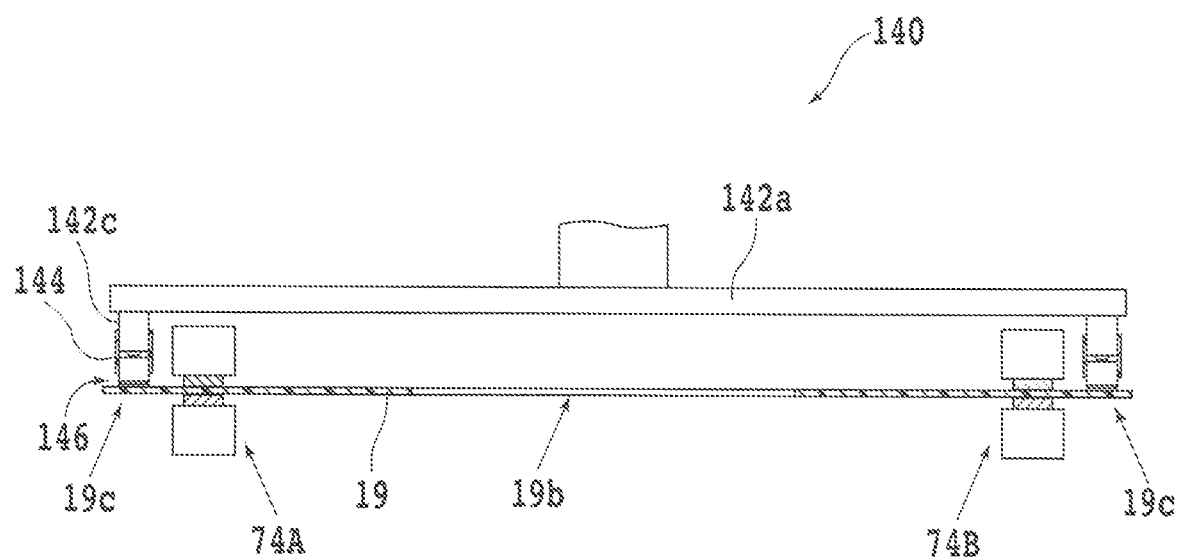
FIG. 9 is a diagram illustrating a sheet suction step.

FIG. 8 is a diagram illustrating the device chip unit separation step S40. Also in FIG. 8, the conveying mechanism 140 is omitted. After the device chip unit separation step S40, the support column 114*a* is lowered by the Z-axis direction movement mechanism 116. In addition, the piston 138*b* is stretched downward to lower the conveying mechanism 140 toward the sheet 19 in the expanded state. Then, an outer circumferential part 19*c* of the sheet 19 located outside relative to the end parts in the Y-axis direction in the first clamping unit 74A and the second clamping unit 74B is sucked and held by the suction parts 146 of the conveying mechanism 140 (sheet suction step S50). FIG. 9 is a diagram illustrating the sheet suction step S50. In FIG. 9, the frame disposing unit 110 is omitted.

After the sheet 19 is held by the suction parts 146, the upper clamping part and the lower clamping part of each clamping unit are separated in the Z-axis direction to thereby release the clamping of the sheet 19 by each clamping unit. Thereafter, the first clamping unit 74A is moved to the one side in the X-axis direction, and the second clamping unit 74B is moved to the other side in the X-axis direction. Further, the third clamping unit 74C is moved to the other side in the Y-axis direction, and the fourth clamping unit 74D is moved to the one side in the Y-axis direction. In this manner, each clamping unit is evacuated from the sheet 19 (clamping unit evacuation step S60).

Figure 10:
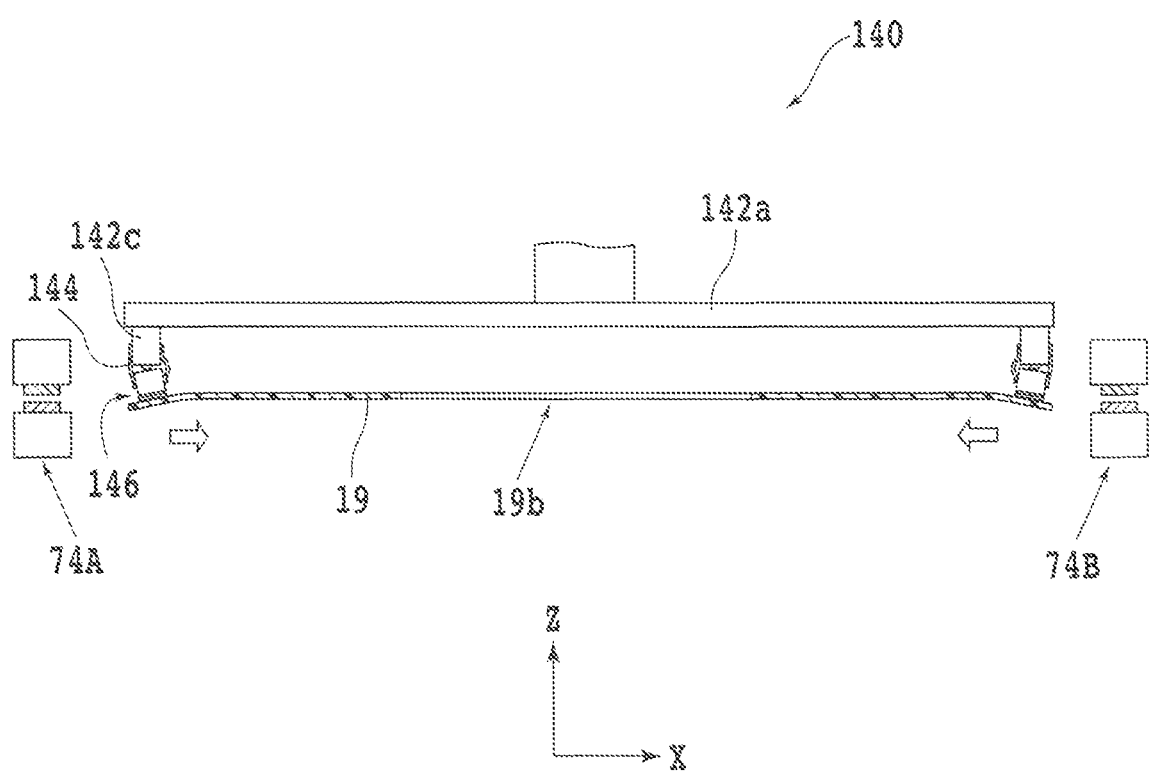
FIG. 10 is a diagram illustrating a clamping unit evacuation step.

FIG. 10 is a diagram illustrating the clamping unit evacuation step S60. Also in FIG. 10, the frame disposing unit 110 is omitted. Further, in FIG. 6 to FIG. 10, the third clamping unit 74C and the fourth clamping unit 74D are omitted. In the clamping unit evacuation step S60, the expanded sheet 19 contracts due to the release of the external force. Therefore, deformation or the like occurs in the sheet 19. However, as described above, the suction part 146 and the joint 148 can integrally swing, and thus the orientation of the bottom surfaces of the suction pads 146*b* can change to follow the surface of the sheet 19.

After the clamping unit evacuation step S60, the conveying mechanism 140 is moved to above a sheet disposal region (not illustrated) disposed on the one side of the expanding unit 72 in the Y-axis direction. In the sheet disposal region, a disposal box 158 in which the used sheets 19 are disposed is set. The disposal box 158 has, in the upper part, a rectangular opening larger than the size of the bracket 142 in the XY-plane direction when the bracket 142 is viewed in top view. The disposal box 158 is a rectangular parallelepiped box body composed of four side plates and one bottom plate.

The conveying mechanism 140 releases the suction holding of the used sheet 19 above the disposal box 158 to cause the sheet 19 to drop downward (sheet disposal step S70). Thereby, the used sheet 19 is conveyed to the disposal box 158. FIG. 11 is a diagram illustrating the sheet disposal step S70. Also in FIG. 11, the frame disposing unit 110 is omitted. In the present embodiment, after the sheet disposal step S70, the joints 148 are swung by the restoring force of the elastic components 144, and the orientation of the bottom surfaces of the suction pads 146*b* is returned to the original predetermined orientation. Therefore, there is an advantage that operation when the sheet 19 is sucked next by using the conveying mechanism 140 is not inhibited. After S70, the frame disposing unit 110 moves to the upper side of a conveying table that is not illustrated in the diagram and transfers the device chip unit 27 to the conveying table. Thereafter, the device chip unit 27 is conveyed to a predetermined region in the sheet expanding apparatus 2 by the conveying table.

Figure 13:
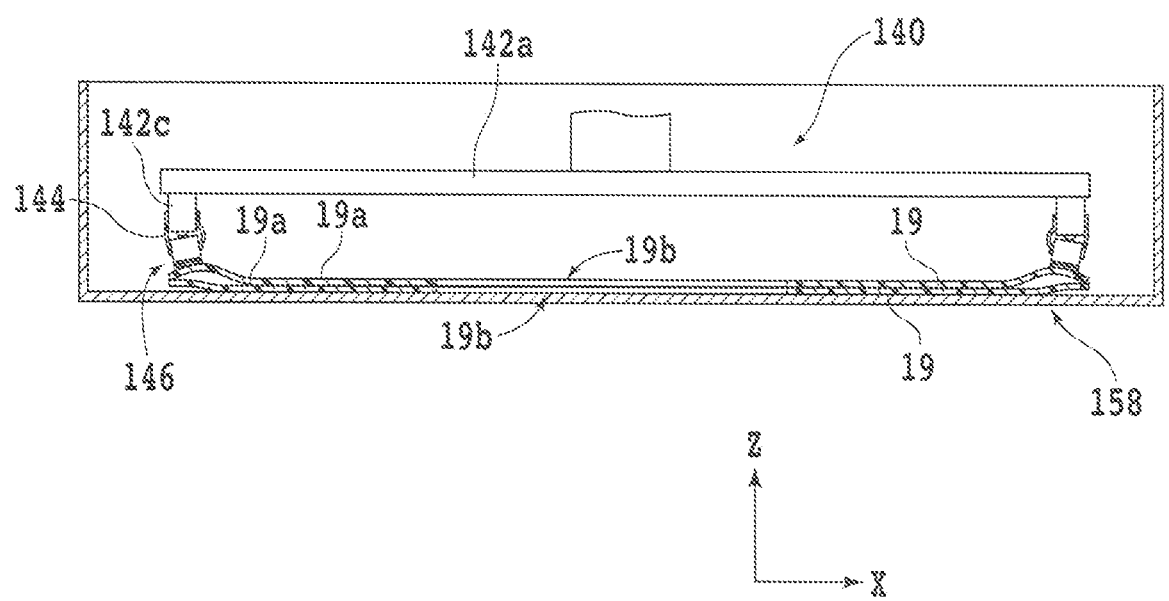
FIG. 13 is a diagram illustrating the sheet disposal step according to a modification example.

Next, a modification example of the sheet disposal step S70 will be described. FIG. 13 is a diagram illustrating the sheet disposal step S70 according to the modification example. In FIG. 13, the frame disposing unit 110 is omitted. In this modification example, the conveying mechanism 140 conveys the bracket 142 to the inside of the disposal box 158 in the state in which the sheet 19 is sucked and held by the suction parts 146. Then, the bracket 142 is lowered until the other surface of the sheet 19 (surface of the base layer located on the opposite side to the adhesive layer) gets contact with the upper surface of the bottom plate of the disposal box 158. Thereafter, the suction of the sheet 19 is released.

Next, the bracket 142 is raised. In this manner, the first piece of the sheet 19 is placed on the bottom plate of the disposal box 158. Further, after a second round of S10 to S60, also in a second round of the sheet disposal step S70, similarly the conveying mechanism 140 conveys the bracket 142 to the inside of the disposal box 158 in the state in which the sheet 19 is sucked and held. Due to this, the second piece of the sheet 19 is pressed against and bonded to the one surface 19*a* of the first piece of the sheet 19 previously housed in the disposal box 158. Thereafter, the suction of the sheet 19 is released. In this manner, the second and subsequent pieces of the sheets 19 are disposed at substantially the same position in the XY-plane direction on the sheet 19 previously housed in the disposal box 158. Therefore, the used sheets 19 are stacked in the Z-axis direction comparatively orderly. Thus, the height of the stacking body formed of the used plural sheets 19 can be suppressed compared with a case in which plural pieces of the sheets 19 are randomly stacked. Accordingly, conveyance, disposal, and so forth of this stacking body becomes easy.

Figure 14:
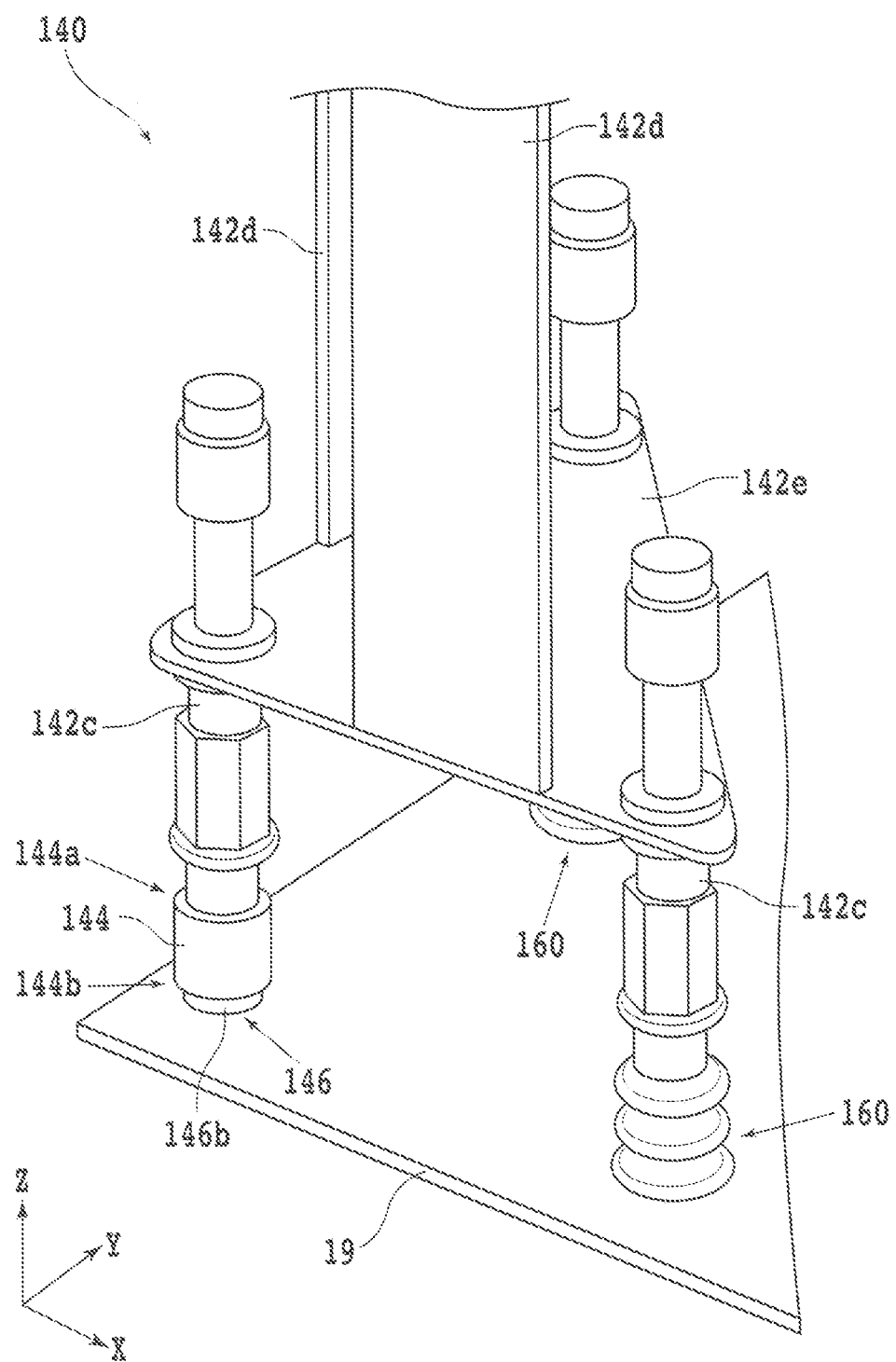
FIG. 14 is a partial enlarged view of the conveying mechanism according to a second embodiment.

Next, a second embodiment will be described. FIG. 14 is a partial enlarged view of the conveying mechanism 140 according to the second embodiment. In the conveying mechanism 140 of the second embodiment, the upper parts of two plate-shaped columns 142d are fixed to each of the lower parts of both end parts of the straight line parts 142a of the bracket 142. The longitudinal parts of the respective columns 142d are each disposed in substantially parallel to the Z-axis direction. A horizontal plate 142e with a right triangle shape in top view is fixed to the lower part of each column 142d. The above-described cylindrical part 142c is fixed to a right-angle-shaped part and each of two acute-angle-shaped parts of the horizontal plate 142e.

A hose, a tube, or the like that configures the flow path 150 is connected to the upper part of each cylindrical part 142c. In FIG. 14, the hose or the like is omitted. The upper end part 144a of the above-described elastic component 144 is fixed to the lower part of the cylindrical part 142c disposed at the right-angle-shaped part of the horizontal plate 142e. Moreover, the upper part of the outer circumferential side surface of the suction part 146 is fixed to the lower end part 144b of the elastic component 144. The central part of the upper part of the suction part 146 is fixed to the lower part of the joint 148 similarly to the first embodiment.

Figure 15:
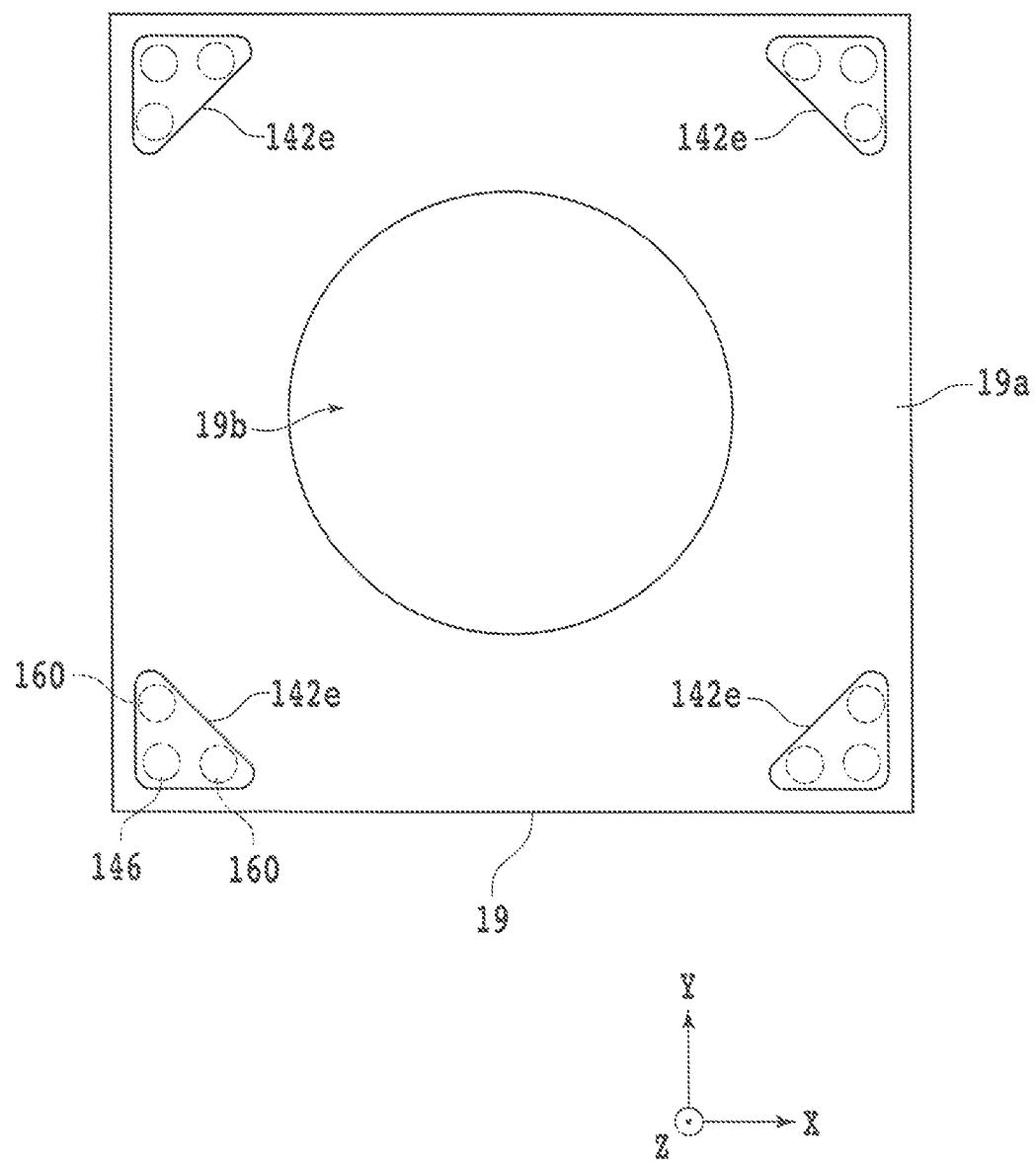
FIG. 15 is a diagram illustrating the positional relation between the suction pad and bellows-shaped suction pads.

A bellows-shaped suction pad 160 is fixed to the cylindrical part 142c disposed at each of the two acute-angle-shaped parts of the horizontal plate 142e. The surfaces of the bellows-shaped suction pads 160 are also covered by a releasing agent similarly to the suction pad 146b of the suction part 146. The bellows-shaped suction pads 160 and the suction pad 146b of the suction part 146 suck and hold the one surface 19a of the sheet 19. FIG. 15 is a diagram illustrating the positional relation between the suction pad 146b and the bellows-shaped suction pads 160 in each horizontal plate 142e.

In the second embodiment, the sheet 19 is sucked and held by the suction pads 146b and the bellows-shaped suction pads 160. Therefore, the sheet 19 can be sucked and held even when deformation or the like occurs in the sheet 19 and the sheet 19 gets separated from any one of the suction pads 146b and the bellows-shaped suction pads 160. That is, the sheet 19 can be sucked and held more surely compared with the first embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A conveying mechanism that sucks and holds a target object and conveys the target object, the conveying mechanism comprising:
    a suction part that has a suction pad and sucks and holds the target object by the suction pad;
    a bracket connected to the suction part through a joint that is swingable;
    an elastic component in which one end part is fixed to the suction part and the other end part is fixed to the bracket;
    a negative pressure control unit that has a valve disposed on a predetermined flow path connected to the suction part and controls generation of a negative pressure at the suction part; and
    a movement unit that moves the bracket, wherein
    the elastic component permits a swing of the suction part according to tilt or deformation of the target object that is sucked and held and, when suction holding of the target object is released, the elastic component returns an orientation of the suction pad to a predetermined orientation when the suction pad is not sucking and holding the target object.

2. The conveying mechanism according to claim 1, wherein
    the elastic component is a rubber sheet, a resin sheet, an elastomer sheet, or a spring.

3. A sheet expanding apparatus that expands a sheet stuck to a plate-shaped object, the sheet expanding apparatus comprising:
    an expanding unit that expands the sheet that is stuck to the plate-shaped object and has a rectangular shape in a predetermined planar direction;
    a frame disposing unit that has a first suction pad for sucking an annular frame in which an opening having a diameter larger than size of one surface of the plate-shaped object is formed, and that disposes the annular frame on a side of one surface of the sheet expanded by the expanding unit in such a manner that the annular frame surrounds the plate-shaped object;
    a cutting unit that has a cutting blade and is for cutting, by the cutting blade, outside of the opening in the sheet to which the plate-shaped object and the annular frame are stuck; and
    a conveying mechanism that sucks and holds an outer circumferential part of a hole formed through cutting by the cutting blade in the sheet and conveys the sheet to a disposal box, wherein
    the conveying mechanism includes
        a suction part that has a second suction pad and sucks and holds the sheet by the second suction pad,
        a bracket connected to the suction part through a joint that is swingable,
        an elastic component in which one end part is fixed to the suction part and the other end part is fixed to the bracket,
        a negative pressure control unit that has a valve disposed on a predetermined flow path connected to the suction part and controls generation of a negative pressure at the suction part, and
        a movement unit that moves the bracket, and
    the elastic component permits a swing of the suction part according to tilt or deformation of the sheet that is sucked and held and, when suction holding of the sheet is released, the elastic component returns an orientation of the second suction pad to a predetermined orientation when the second suction pad is not sucking and holding the sheet.

4. The sheet expanding apparatus according to claim 3, wherein
    the conveying mechanism causes the sheet sucked and held by the suction part to be pressed against and bonded to the one surface of the sheet previously housed in the disposal box and then releases suction of the sheet to stack the sheet pressed and bonded on the sheet previously housed in the disposal box.

\* \* \* \* \*